(12) United States Patent
Kolman

(10) Patent No.: US 7,378,862 B2
(45) Date of Patent: May 27, 2008

(54) METHOD AND APPARATUS FOR ELIMINATING AUTOMATED TESTING EQUIPMENT INDEX TIME

(75) Inventor: Robert Stanley Kolman, Longmont, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 59 days.

(21) Appl. No.: 11/262,226

(22) Filed: Oct. 28, 2005

(65) Prior Publication Data

US 2007/0096758 A1 May 3, 2007

(51) Int. Cl.
*G01R 31/02* (2006.01)

(52) U.S. Cl. .................. 324/763; 324/755; 324/158.1

(58) Field of Classification Search .................. None
See application file for complete search history.

(56) References Cited

U.S. PATENT DOCUMENTS

| | | | |
|---|---|---|---|
| 6,731,127 B2 * | 5/2004 | Watts | 324/765 |
| 6,903,567 B2 * | 6/2005 | Chung et al. | 324/765 |
| 7,151,388 B2 * | 12/2006 | Gopal et al. | 324/765 |
| 7,235,993 B2 * | 6/2007 | Luk | 324/761 |
| 2005/0168233 A1 * | 8/2005 | Roberts et al. | 324/763 |

* cited by examiner

*Primary Examiner*—Minh N. Tang
(74) *Attorney, Agent, or Firm*—Gregory W. Osterloth

(57) ABSTRACT

The present invention eliminates the indexing time of an SOC tester, or at least reduces it to the time delay for an electronic switch to toggle or a mechanical shift to occur between two banks of DUTs to be tested on a DUT load board mounted on a test head.

5 Claims, 7 Drawing Sheets

METHOD AND APPARATUS FOR ELIMINATING AUTOMATED TESTING EQUIPMENT INDEX TIME

BACKGROUND

The present invention relates to devices, systems and methods for testing electronic circuits using automated test equipment, and more particularly to devices, systems and methods for testing systems-on-a-chip (SOC) or other integrated circuits. Manufacturers typically test SOC integrated circuits (ICs) in order to ensure proper functionality and reliability. One system commonly employed to test SOC ICs is the Agilent 93000 SOC Tester, which supports concurrent tests. Portions of the Agilent 93000 SOC tester are described in U.S. Pat. No. 6,756,778 to Hirschmann, entitled "Measuring and Calibrating a Test Head"; U.S. Pat. No. 5,558,541 to Botka et al., entitled "Blind Mate Connector for an Electronic Circuit Tester"; and U.S. Pat. No. 5,552,701 to Veteran et al, entitled "Docking System for an Electronic Circuit Tester".

FIG. 1 shows the Agilent 93000 Tester 100, comprising a test head 110 with a device under test (DUT) interface 120; a manipulator 130 for positioning test head 110; a DUT board 150 that plugs into underlying DUT interface 120; a support rack 140 for supplying test head 110 with electrical power, water cooling and compressed air (not shown) and a computer workstation (not shown) that serves as the user interface to Tester 100. Test head 110 comprises tester electronics and additional analog modules. With current technology, test head 110 may be configured with 512 pins or 1024 pins, but this will likely increase in the future. The 512 pin test head supports 4 card cages while the 1024 pin test head supports 8 card cages. Each card cage may contain 8 digital boards or 8 analog modules, respectively. A single board has 16 pins, making 128 pins per cage. Thus, a 4-cage test head contain 512 pins and an 8-cage test head 1024 pins. During testing, a DUT is mounted on a contactor (not shown) on the DUT board 150, which is connected to the I/O channels by DUT interface 120. DUT interface 120 may comprise high performance coax cabling and spring contact pins or pogo pins, which establish electrical connection with DUT board 120.

DUT interface 120 provides docking capabilities to handlers and wafer probers. The docking mechanism is controlled by compressed air (not shown), and if required may also be operated manually. Test head 110 is usually a water-cooled system and receives its cooling water supply from support rack 140, which in turn is connected by two flexible hoses to the cooling unit (not shown). Manipulator 130 supports and positions test head 110 and provides 6 degrees of freedom for precise and repeatable connections between test head 100 and handlers or wafer probers.

Support rack 140 is attached to manipulator 130 and serves as the interface between test head 110 and an AC power source, cooling water source and compressed air source. Tester 100 may also comprise additional support racks such as analog support racks for installing additional analog instruments.

An HP-UX workstation (not shown) may serve as the interface between the user and tester 100. At the present time, Agilent 93000 SOC Series SmarTest software runs on the HP-UX workstation under the HP-UX operating system, although other suitable operating systems such as Linux or other workstations may certainly be used. SmarTest allows setups and test data to be downloaded to the test system, and further permits editing of such information. All testing is carried out in the test system. Results are read back by the workstation and displayed on the monitor. During test program execution, upload and download are typically not required since the test processors act independently from the workstation once the test program has begun running.

On the workstation, a diagnostic program can be run to check the system periodically or to identify the source of a problem. Configuration of Tester 100 involves assigning digital channel boards, power supplies, and analog instruments to specific channels of the test head and providing for associated mainframe components (such as an alternate master clock (AMC)) external to the test head. Test heat electronic components supply power to the various DUTs and perform measurements. Some test head functions and key elements are: 1) conversion and distribution of supply voltages; 2) interfacing via fiber optic cable to the workstation; 3) internal communication via data bus, address bus and control bus; 4) communication clock generation and distribution; 5) master clock generation and distribution; 6) high precision parametric measurement unit (HP PMU); 7) interfacing with external clock; 8) supplying power to the DUT; and 9) making channel measurements; among other things.

Each pin in the platform provides period, timing, levels, patterns and sequencing, enabling each tester pin to independently operate in any number of different modes. Instead of sharing testing resources, every pin supports a full range of tester modes, including clock, SCAN, BIST control, functional, APG and digital source and capture. Such flexibility in Tester 100 allows for on-the-fly grouping of pins into virtual ports to test target IP blocks. As a result, the platform is capable of testing multiple blocks concurrently. Once a test has been completed, tester pins may be immediately reconfigured and assembled into new port configurations to conduct a completely different set of tests.

The architecture of Tester 100 provides support for concurrent tests on potentially dozens of ports with different sequencing and digital data rates. The test-processor-per-pin architecture of Tester 100 allows it to function as a scalable platform. Tester 100 supports test technologies that include RF, analog, digital and mixed signal, each fully capable of being used concurrently. FIG. 2 illustrates the placing of DUT 160 on packaged parts DUT board 150, and the positioning of DUT board 150 above test head 110.

FIG. 3 illustrates a wafer prober DUT board 155 on top of DUT interface 120. Several further components are then stacked atop wafer prober DUT board 155; pogo tower 165; probe card 180 and wafer to be tested 190. DUT board 155, stiffener assembly 170 and pogo tower 165, together form a Wafer Prober Interface (WPI), which is made in two sizes: a 9.5 inch WPI and a 12 inch WPI. A WPI DUT board (small or large, corresponding to 512 or 1024 pins) connects the pogo pins of the test head electronics to the pogo pins of pogo tower 165. It also maps the rectangular pogo pin layout of the test head to the circular contact layout of the pogo tower probe card. A standard DUT board provided by Agilent contains an EEPROM that identifies the board. Customized WPI DUT boards may have different pin mapping, connect several pins, or provide relays and filter circuits.

FIG. 6 shows a DUT load board 200 with 16 device locations 210. System-on-a-chip ICs that are to be tested on Tester 100 are loaded one-by-one onto a DUT load board 200 of test head 110. Electronic tests are then performed on each of the SOC ICs, after the completion of which the SOC ICs are removed one-by-one from DUT load board 200, which is plugged into test head 110.

FIG. 4 shows a conceptual time line for an existing DUT board 200 approach to testing. Specifically, time to load (300, 310) devices or DUTs onto DUT load board 200 test locations 210 and time to unload (320, 330) devices or DUTs from DUT load board 200 test locations 210, no electronic testing of devices occurs. As can be seen in the time line 350, the time it takes to unload a group of devices that have been tested and then load a second group of devices to be tested onto a test head 110 is dead time, in which no testing is occurring. This dead time for device or DUT loading (300, 310) and unloading (320, 330) is referred to as the index time. The testing time is shown conceptually as 340 and 345 on the testing time line 350. Currently, the index time for most SOC IC testers is up to approximately 10% of test time.

As IC testing is expensive and time consuming, it will be readily appreciated that reducing the index time, and thus the overall test time, will be advantageous. Reducing the amount of time consumed loading and unloading DUTs onto test heads will result in a reduction in the time and correspondingly, the cost required to test ICs.

BRIEF DESCRIPTION OF THE DRAWINGS

An understanding of the present teachings can be gained from the following detailed description, taken in conjunction with the accompanying drawings of which.

DETAILED DESCRIPTION

Test time is a critical cost for SOC developers. Material handling that slows down the test process is an expense that needs to be reduced or eliminated wherever possible. During package testing, material handling has always been a "dead-time" when testing could not be performed. A DUT load board 200 would be stationary, loaded and unloaded with DUTs for testing. The time to remove tested parts and insert new parts to be tested is referred to as the "index time". The present invention eliminates the indexing time, or at least reduces it to the time delay for an electronic switch to toggle or a mechanical shift to occur between two banks of DUTs to be tested.

Figure 7:
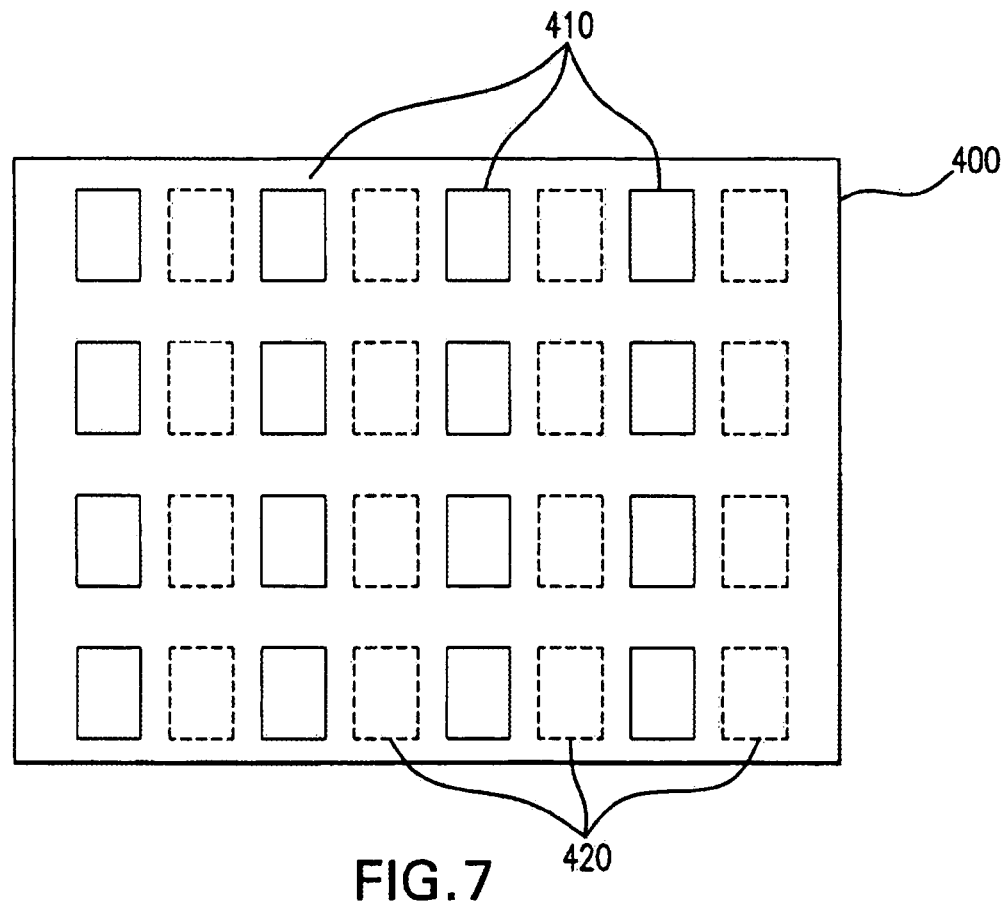
FIG. 7 illustrates a DUT load board in accordance with an embodiment of the present invention with two banks, each accommodating 16 devices.
Figure 8:
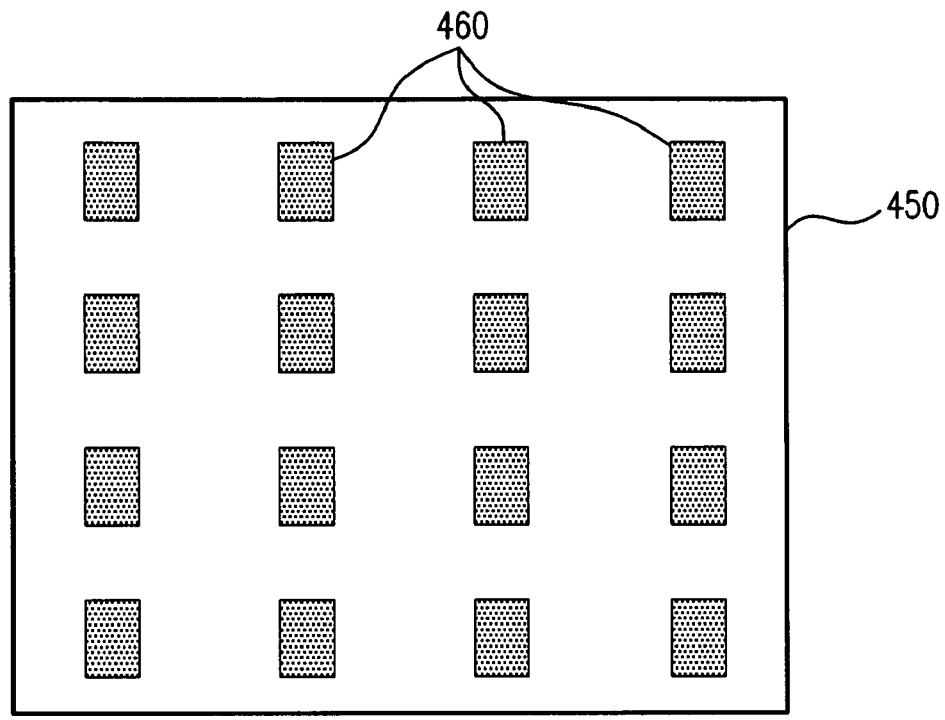
FIG. 8 illustrates tester interface locations.

Specifically, FIG. 7 illustrates a DUT load board 400 with a first "A" bank 410 and a second "B" bank 420 of locations. Bank "A" locations 410 and bank "B" locations 420 are for testing 16 devices or DUTS. FIG. 8 shows a DUT load board to tester interface board 450 with tester interface locations 460. Tester interface locations 460 correspond to Bank "A" locations 410 and bank "B" locations 420.

Figure 9:
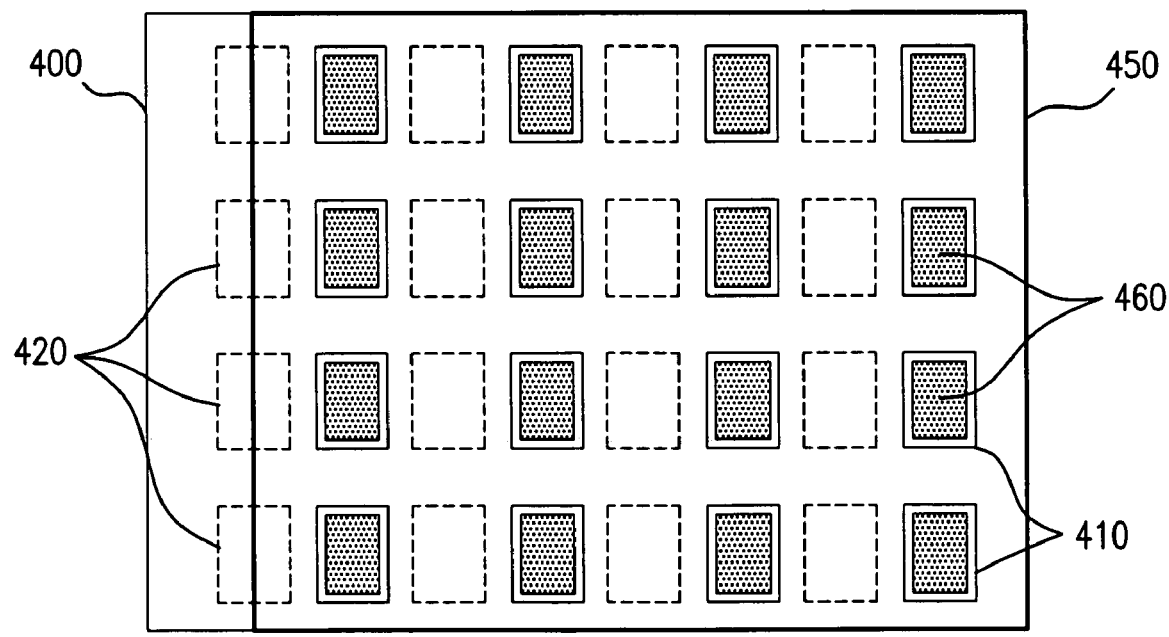
FIG. 9 illustrates tester interface locations to test bank "A" DUT locations in accordance with the present invention.
Figure 10:
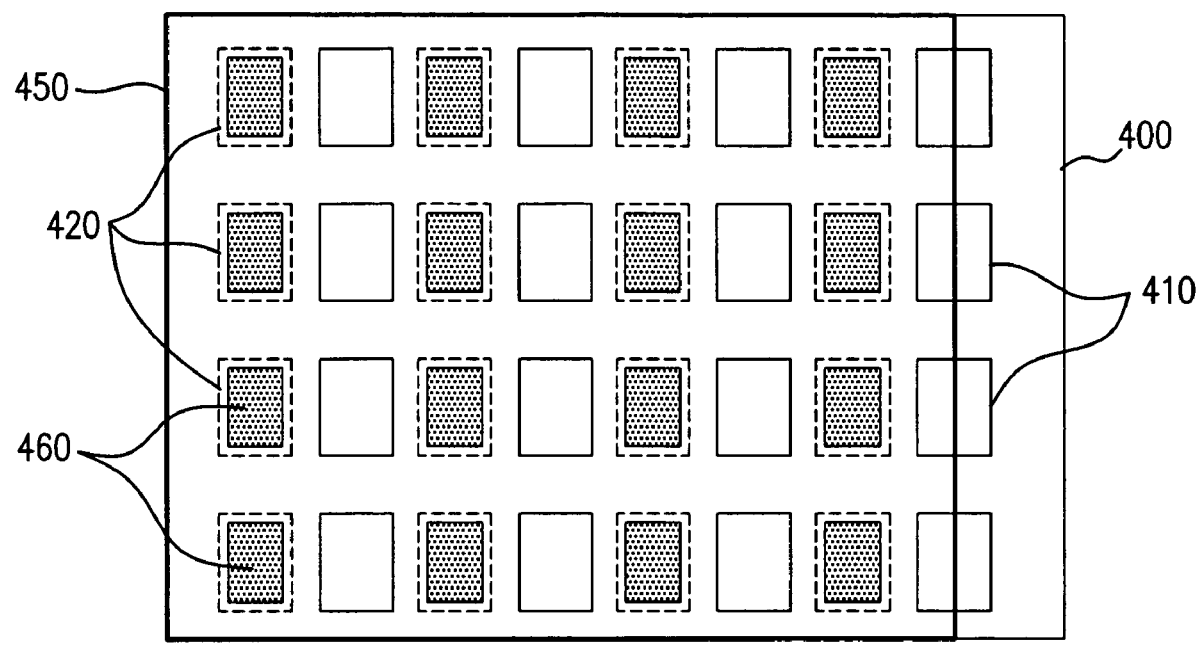
FIG. 10 illustrates tester interface locations to test bank "B" DUT locations in accordance with the present invention.

FIG. 9 illustrates a tester interface board 450 superimposed over DUT load board 400 with tester interface locations 460 corresponding with Bank "A" locations 410, leaving Bank "B" locations 420 open or unmated. FIG. 10 illustrates tester interface board 450 superimposed over DUT load board 400 with tester interface locations 460 corresponding with Bank "B" locations 420, leaving Bank "A" locations 410 open or unmated.

DUT load board 400 may switch, either mechanically or electrically, between Bank "A" and Bank "B" of DUT sockets. The switching may be either a mechanical switching of the DUT load board 400 or an electrical switching, requiring no mechanical changes, thus being much faster, and lower maintenance mechanically. While bank "A" of DUTs is being tested, bank "B" of DUTs may be unloading and reloading, then the DUT load board 400 may be switched to bank "B" of DUTs and bank "A" of DUTs may be unloaded and reloaded with DUTs to be tested. Thus, the indexing time may be hidden and the overall testing time reduced by the indexing time.

The new DUT load board 400 would require twice the current number of sockets or DUT test locations 410 and 420. These would be conceptually grouped into a first and second bank of test locations. While one bank is electrically connected to the tester and being tested (from the under side of the DUT load board 400), the other bank is electrically disconnected, unloaded and reloaded with DUT devices to be tested. Mechanical switching may require a more complex DUT load board with additional mechanisms to physically move the board to change the alignment between the tester pins and the Bank "A" and Bank "B" connection pads. Electrical switching may have duplicate electrical hook-ups to both banks and a toggle switch or similar device for switching between the two banks.

If a prober handler (not shown) that inserts and removes DUTs is used, then it would have to be programmed to recognize the two alternate bank locations, rather than the typical single bank layout. This would be the case whether mechanical or electrical switching is employed but, again, electrical switching will probably make the prober handler's programming and alignment issues simpler. The present invention basically permits unloading tested devices and reloading devices to be tested in parallel with running the test, thus essentially removing the loading and unloading of devices from the DUT load board from the testing time line. While previously the mechanical handling of the devices was done sequentially with the testing and added approximately 10% to the testing time.

Figure 1:
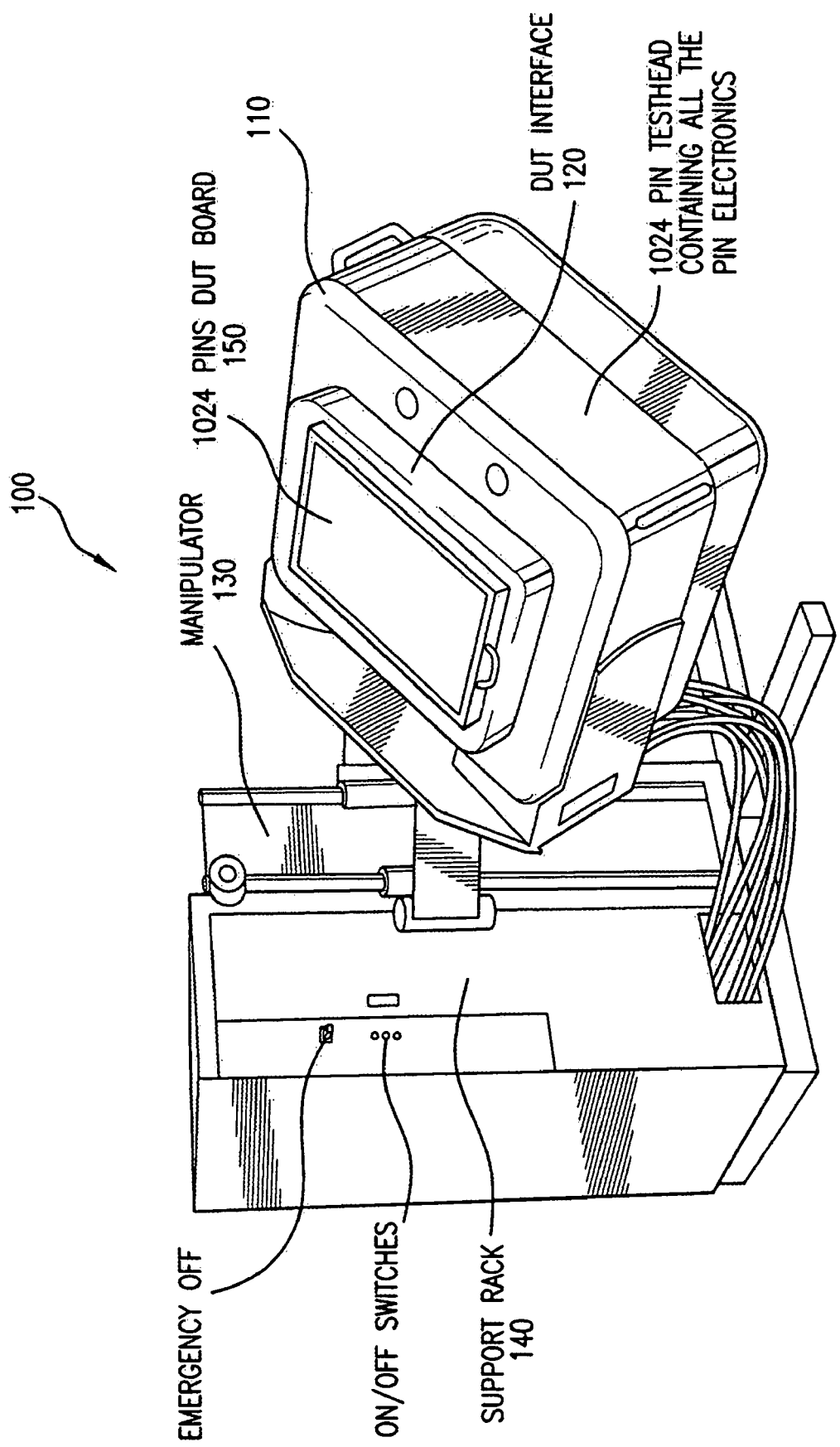
FIG. 1 shows an Agilent 93000 SOC Tester.
Figure 2:
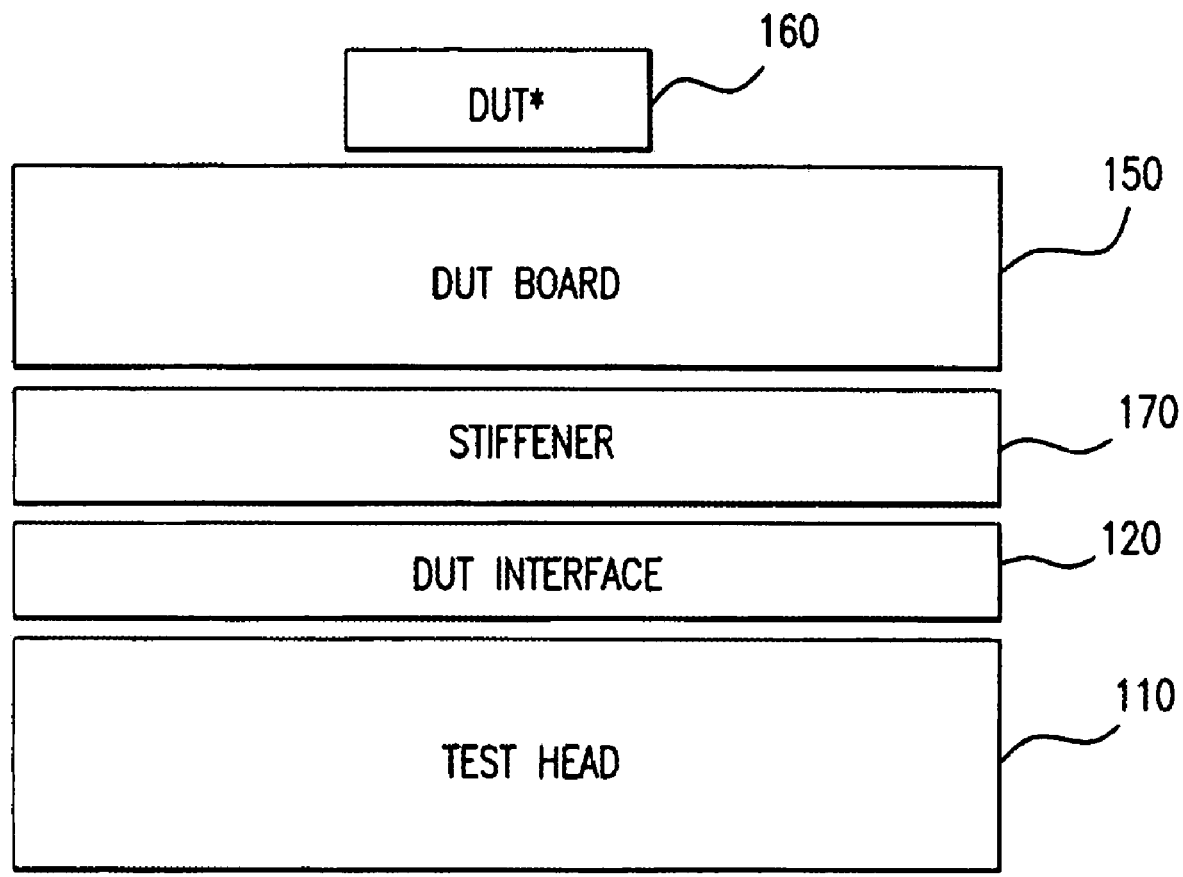
FIG. 2 shows a cross-section of a DUT and DUT board connections to a test head of a typical SOC tester.
Figure 3:
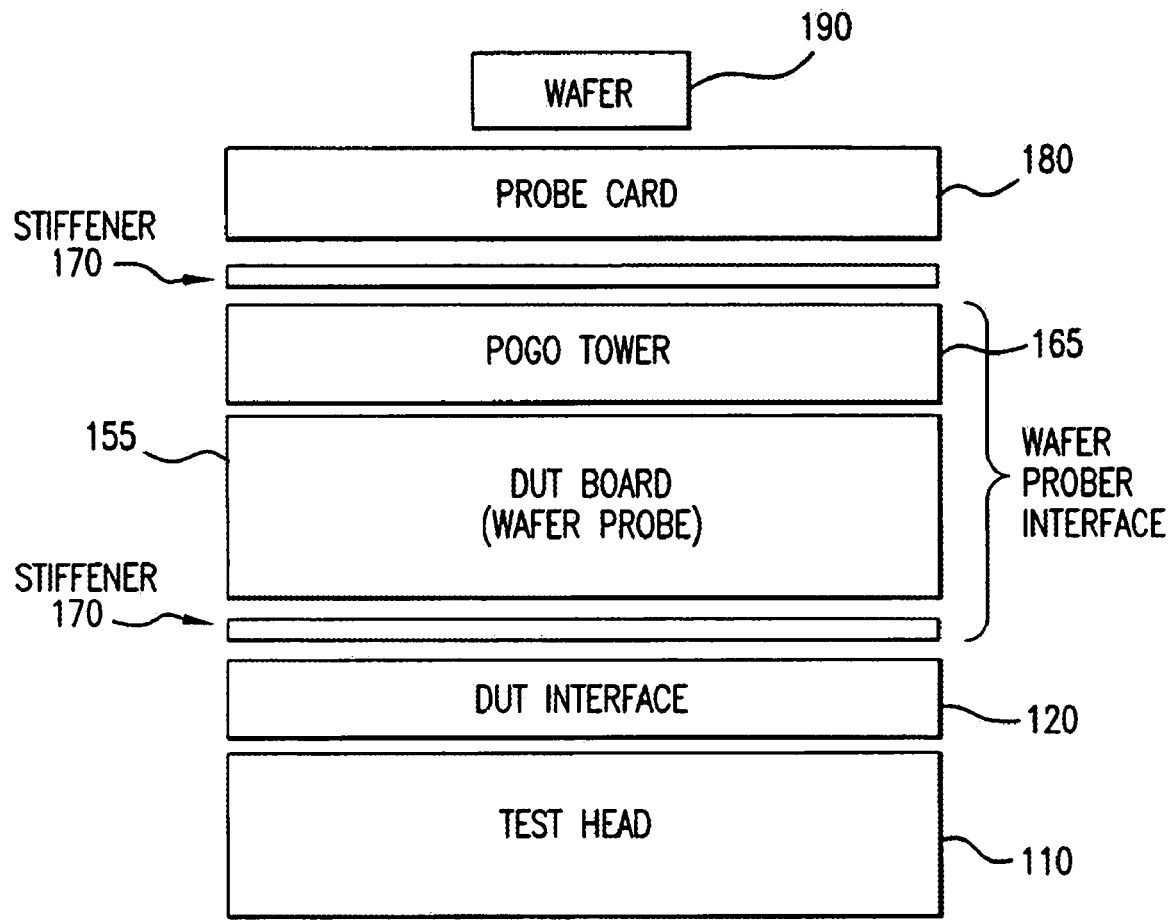
FIG. 3 shows a cross-section of a wafer, probe card and DUT interface connection to a test head of a typical SOC tester.
Figure 4:
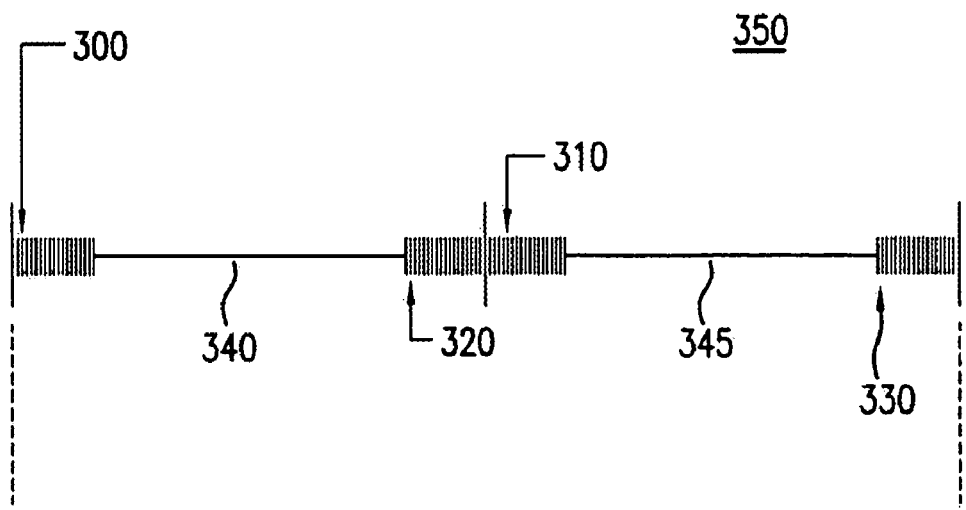
FIG. 4 illustrates a typical time line for existing SOC testers.
Figure 5:
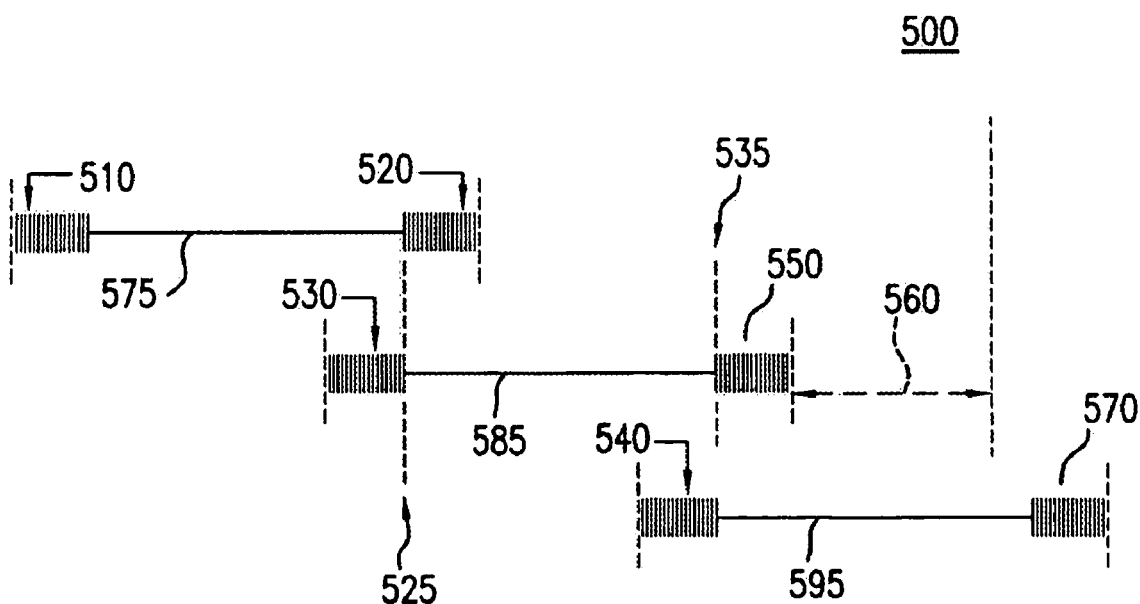
FIG. 5 illustrates a time line in accordance with the present invention.
Figure 6:
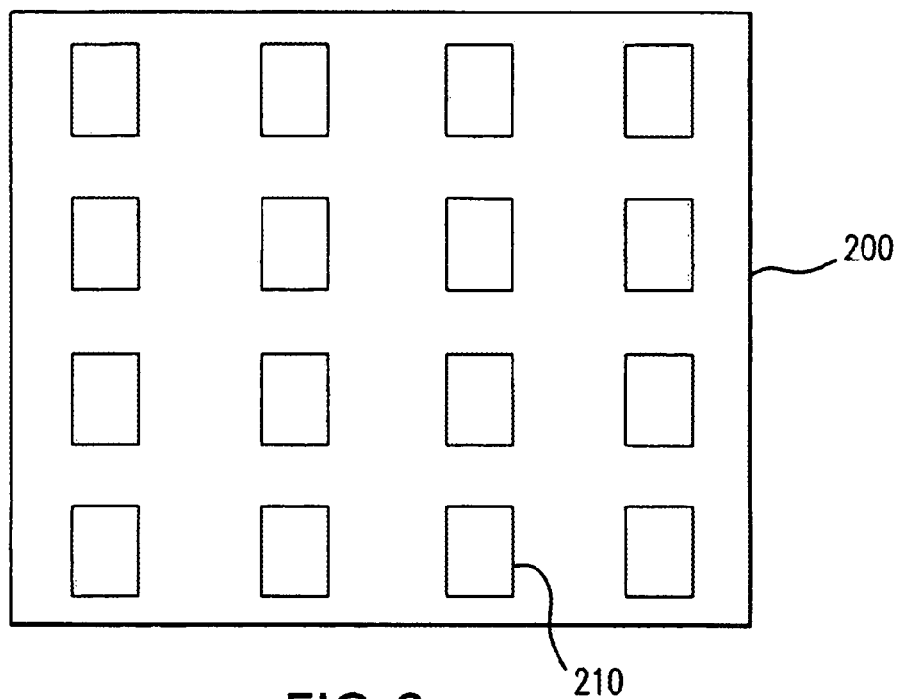
FIG. 6 illustrates a typical DUT load board for 16 devices.

FIG. 5 shows a conceptual time line 500 for testing with 2 banks of test locations in accordance with the present invention. The time line shows the time to load devices into bank "A" 510; the time to test devices in bank "A" 575; the time to load devices in bank "B" 530; switch testing from bank "A" to Bank "B" 525; the time to unload 520 and load 540 devices to be tested into bank "A", while bank "B" is being tested 585; switching 535 testing from bank "B" back to bank "A"; unloading 550 and loading (not shown) devices from bank "B", while bank "A" is testing 595.

The time saved by handling devices in parallel with testing a second bank of devices over the sequential testing and handling of devices in a single bank is shown as 560 on the time line 500 of FIG. 5.

It will be readily appreciated by one of ordinary skill in the art that other designs and embodiments may be implemented without departing from the concepts of the present invention. For example, other numbers of devices to be tested beside 16 may be implemented on the DUT load board. Also, other layouts of the first and second banks may be implemented. While, the present drawings illustrate the two banks being essentially the same layout overlaid with each other, this is not necessary and other patterns and layouts are possible. Also, while the time lines illustrate conceptually unloading a bank at the start of testing the other bank and reloading toward the end of testing, this is not necessary. The basic concept is at least two banks of devices with the mechanical handling of one bank (loading and unloading) happening in parallel with the testing of the second bank of devices with a mechanical or electrical switch happening between the two banks and activities. Any number or physical locations of devices is shown only for the purposes of illustration of the invention and should not be considered limiting to the number or pattern shown.

The invention claimed is:

1. An SOC tester system comprising:
   a test head;
   a DUT load board with a first bank of DUT test locations and a second bank of DUT test locations, the DUT load board being mounted on and electrically connected to the test head;
   a handler, wherein the test head tests a first bank of DUTs in the first bank of DUT test locations while the handler removes DUTs from and inserts DUTs into the second bank of DUT test locations; and
   a mechanical switch providing a mechanical shift in alignment of the first bank of DUT test locations and the second bank of DUT test locations that switches between testing the first bank of DUT test locations and the second bank of DUT test locations.

2. The SOC tester system according to claim 1, further comprising a switch that switches the handler between handling the first bank of DUTs in the first bank of DUT test locations and the second bank of DUTs in the second bank of DUT test locations.

3. An SOC tester DUT load board comprising:
   a first bank of SOC DUT test locations;
   a second bank of SOC DUT test locations; and
   a mechanical switch providing a mechanical shift for switching alignment of tester pins between the first and second banks of test locations.

4. A method for testing devices in an SOC tester comprising the following steps:
   loading a first set of devices into a first bank of DUT test locations on a DUT load board mounted on a test head;
   testing the first set of devices, while simultaneously loading a second set of devices into a second bank of DUT test locations on the DUT load board mounted on the test head;
   mechanically switching alignment of test locations from the first bank of DUT test locations to the second bank of DUT test locations and testing the second set of devices, while simultaneously unloading the first set of devices and loading a third set of devices into the first bank of DUT test locations on the DUT load board mounted on the test head.

5. A method for testing devices in an SOC tester comprising the following steps:
   testing a first set of devices in a first bank of DUT test locations on a DUT load board mounted on a test head, while simultaneously loadings second set of devices into a second bank of DUT test locations on the DUT load board mounted on the test head;
   mechanically switching alignment of test locations from the first bank of DUT test locations to the second bank of DUT test locations;
   testing the second set of devices in the second bank of DUT test locations on the DUT load board mounted on the test head, while simultaneously unloading the first set of devices from the first bank of DUT test locations on the DUT load board and loading a third set of devices onto the first bank of DUT test locations on the DUT load board.

* * * * *